US009887153B2

(12) United States Patent
Chen et al.

(10) Patent No.: US 9,887,153 B2
(45) Date of Patent: Feb. 6, 2018

(54) CIRCUIT REDISTRIBUTION STRUCTURE UNIT AND METHOD FOR MANUFACTURING CIRCUIT REDISTRIBUTION STRUCTURE

(71) Applicant: Unimicron Technology Corp., Taoyuan (TW)

(72) Inventors: Yu-Hua Chen, Hsinchu (TW); Cheng-Ta Ko, Taoyuan (TW)

(73) Assignee: UNIMICRON TECHNOLOGY CORP., Taoyuan (TW)

(*) Notice: Subject to any disclaimer, the term of this patent is extended or adjusted under 35 U.S.C. 154(b) by 0 days.

(21) Appl. No.: 15/257,897

(22) Filed: Sep. 6, 2016

(65) Prior Publication Data

US 2018/0005931 A1 Jan. 4, 2018

(30) Foreign Application Priority Data

Jun. 30, 2016 (TW) ............................ 105120843 A

(51) Int. Cl.

| | |
|---|---|
| ***H05K 1/00*** | (2006.01) |
| ***H01L 23/498*** | (2006.01) |
| ***H01L 21/48*** | (2006.01) |
| ***H01L 23/00*** | (2006.01) |

(52) U.S. Cl.

CPC .... *H01L 23/49822* (2013.01); *H01L 21/4853* (2013.01); *H01L 21/4857* (2013.01); *H01L 23/49816* (2013.01); *H01L 23/49838* (2013.01); *H01L 23/562* (2013.01)

(58) Field of Classification Search

USPC ................................................. 361/749, 748

See application file for complete search history.

(56) References Cited

U.S. PATENT DOCUMENTS 9,196,554 B2 * 11/2015 Otremba ............ H01L 23/5389
2009/0090541 A1 * 4/2009 Chia .................. H01L 23/5387 174/254

FOREIGN PATENT DOCUMENTS

TW I286814 B 9/2007

* cited by examiner

*Primary Examiner* — Andargie M Aychillhum
(74) *Attorney, Agent, or Firm* — CKC & Partners Co., Ltd.

(57) ABSTRACT

A method for manufacturing a circuit redistribution structure includes the following steps. A first dielectric is formed on a carrier. Conductive blind vias are formed in the first dielectric. A first circuit redistribution layer is formed on the first dielectric. A second dielectric is formed on the first dielectric. First and second holes are formed on the second dielectric. A trench is formed in the second dielectric to divide the second dielectric into first and second portions. A first portion of the first circuit redistribution layer and the first hole are disposed in the first portion of the second dielectric, and a second portion of the first circuit redistribution layer and the second hole are disposed in the second portion of the second dielectric. Conductive blind vias are formed in the first and second holes, and a second circuit redistribution layer is formed on the second dielectric.

3 Claims, 17 Drawing Sheets

CIRCUIT REDISTRIBUTION STRUCTURE UNIT AND METHOD FOR MANUFACTURING CIRCUIT REDISTRIBUTION STRUCTURE

RELATED APPLICATIONS

This application claims priority to Taiwanese Application Serial Number 105120843, filed Jun. 30, 2016, which are herein incorporated by reference.

BACKGROUND

Technical Field

The present disclosure relates to a circuit redistribution structure unit and a method for manufacturing the circuit redistribution structure.

Description of Related Art

With the rapid growth of electronic industry, research and development (R&D) of electronic product gradually enters the pursuit of versatile and high performance. In order to achieve the requirements of high integration and miniaturization of semiconductor components, the requirements of circuit redistribution structures also increase. For example, a line width and a pitch of a circuit redistribution structure are required to be smaller and smaller, and the overall thickness of the circuit redistribution structure is required to be smaller and smaller.

To further improve various characteristics of a circuit redistribution structure, persons in the industry all endeavor to search for the solutions. How to provide a circuit redistribution structure with better characteristics is one of the important research topics, and is also a target that needs to be improved in the related fields.

SUMMARY

This disclosure provides a method for manufacturing a circuit redistribution structure to enhance the structure stability and the wiring density of the circuit redistribution structure, and to reduce the thickness and the manufacturing cost of the circuit redistribution structure.

In one aspect of the disclosure, a method for manufacturing a circuit redistribution structure is provided. The method includes the steps of: forming a first dielectric layer on a carrier; forming a plurality of first holes and a plurality of second holes in the first dielectric layer; respectively forming a plurality of first conductive vias and a plurality of second conductive vias in the first holes and the second holes, and forming a first circuit redistribution layer on the first dielectric layer, in which a first portion of the first circuit redistribution layer is electrically connected to the first conductive vias, and a second portion of the first circuit redistribution layer is electrically connected to the second conductive vias; forming a second dielectric layer on the first dielectric layer and the first circuit redistribution layer; forming a plurality of third holes and a plurality of fourth holes in the second dielectric layer to respectively expose the first portion and the second portion of the first circuit redistribution layer, and forming a trench in the second dielectric layer to expose the first dielectric layer and to divide the second dielectric layer into a first portion and a second portion, in which the first portion of the first circuit redistribution layer and the third holes are disposed in the first portion of the second dielectric layer, and the second portion of the first circuit redistribution layer and the fourth holes are disposed in the second portion of the second dielectric layer; and respectively forming a plurality of third conductive vias and a plurality of fourth conductive vias in the third holes and the fourth holes, and forming a first portion of a second circuit redistribution layer on the first portion of the second dielectric layer and forming a second portion of the second circuit redistribution layer on the second portion of the second dielectric layer, in which the first portion of the second circuit redistribution layer is electrically connected to the third conductive vias, and the second portion of the second circuit redistribution layer is electrically connected to the fourth conductive vias.

In one or more embodiments, the method further includes the steps: forming an encapsulation layer on the second dielectric layer and the second circuit redistribution layer and in the trench; forming a plurality of fifth holes and a plurality of sixth holes in the encapsulation layer to respectively expose the first portion and the second portion of the second circuit redistribution layer; respectively forming a plurality of fifth conductive vias and a plurality of sixth conductive vias in the fifth holes and the sixth holes, and forming a plurality of first conductive bumps and a plurality of second conductive bumps on the encapsulation layer, in which the first conductive bumps are electrically connected to the fifth conductive vias, and the second conductive bumps are electrically connected to the sixth conductive vias; removing the carrier; and cutting the first dielectric layer and the encapsulation layer in the trench to form a first circuit redistribution structure unit and a second circuit redistribution structure unit, in which the first circuit redistribution structure unit includes the first portion of the first dielectric layer, the first conductive vias, the first portion of the first circuit redistribution layer, the first portion of the second dielectric layer, the third conductive vias, the first portion of the second circuit redistribution layer, the fifth conductive vias, the first conductive bumps, and a first portion of the encapsulation layer, and the second circuit redistribution structure unit includes the second portion of the first dielectric layer, the second conductive vias, the second portion of the first circuit redistribution layer, the second portion of the second dielectric layer, the fourth conductive vias, the second portion of the second circuit redistribution layer, the sixth conductive vias, the second conductive bumps, and a second portion of the encapsulation layer.

In one or more embodiments, the method further includes: respectively forming a plurality of the first micro bumps and a plurality of second micro bumps on the first conductive vias and the second conductive vias exposed by the first dielectric layer after the carrier is removed. The first circuit redistribution structure unit includes the first micro bumps, and the second circuit structure unit includes the second micro bumps.

In one or more embodiments, the trench is further formed in the first dielectric layer to expose the carrier, and the trench divides the first dielectric layer into the first portion and the second portion.

In one or more embodiments, the first holes, the second holes, the third holes, and the fourth holes are formed by exposure and development.

In one or more embodiments, the first conductive vias, the second conductive vias, the third conductive vias, the fourth conductive vias, the fifth conductive vias, the sixth conductive vias, the first circuit redistribution layer, the second circuit redistribution layer, the first conductive bumps, and the second conductive bumps are formed by electroplating.

In one or more embodiments, the encapsulation layer is formed by lamination.

In another aspect of the disclosure, a circuit redistribution structure is provided. The circuit redistribution structure includes a first dielectric layer, a plurality of first conductive vias, a first circuit redistribution layer, a second dielectric layer, a plurality of second conductive vias, a second circuit redistribution layer, an encapsulation layer, a plurality of third conductive vias, a plurality of conductive bumps, and a plurality of micro bumps. The first conductive vias are disposed in the first dielectric layer. The first circuit redistribution layer are disposed on the first dielectric layer and electrically connected to the first conductive vias. The second dielectric layer is disposed on the first dielectric layer and the first circuit redistribution layer. The second conductive vias are disposed in the second dielectric layer and electrically connected to the first circuit redistribution layer. The second circuit redistribution layer is disposed on the second dielectric layer and electrically connected to the second conductive vias. The encapsulation layer is disposed on the second dielectric layer and the second circuit distribution layer, in which the second dielectric layer has a first surface, a second surface opposite to the first surface, and a side surface connecting the first surface and the second surface, and the second circuit redistribution layer is disposed on the first surface, and the encapsulation layer covers the first surface and the side surface. The third conductive vias are disposed in the encapsulation layer and electrically connected to the second circuit redistribution layer. The conductive bumps are disposed on the encapsulation layer and electrically connected to the third conductive vias. The micro bumps are disposed on one side of the first dielectric layer opposite to the second dielectric layer and respectively electrically connected to the first conductive vias.

In one or more embodiments, the encapsulation layer is further disposed on the first dielectric layer exposed by the second dielectric layer, and a thickness of the encapsulation layer disposed on the first dielectric layer is greater than a thickness of the encapsulation layer disposed on the second dielectric layer.

In one or more embodiments, the first dielectric layer and the second dielectric layer are made of photosensitive dielectric material.

Because the trenches are formed to divide the second dielectric layer into two portions, the internal stress of the second dielectric layer will be relieved, such that the warpage of the overall structure will not happen. Therefore, the structure stability is enhanced. At the same time, because the warpage of the overall structure will not happen, the line widths and pitches of the first circuit redistribution layer and the second circuit redistribution layer can become smaller without affecting the circuit stability of the circuit redistribution structure, such that the performance of the circuit redistribution structure is enhanced. Finally, because the internal stress of the second dielectric layer is relieved, the warpage of the overall structure will not happen even when the circuit redistribution structure does not include an interposer structure. Therefore, because the circuit redistribution structure does not include the interposer structure, the thickness and the material cost of the circuit redistribution structure unit are significantly reduced. At the same time, because the assembling processes related to the interposer structure are not needed, the manufacturing cost can be further reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1A:
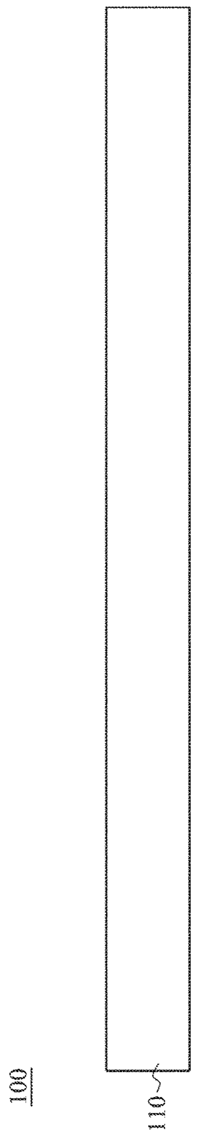
FIG. 1A to FIG. 1O are schematic cross-sectional views of intermediate steps in a method for manufacturing a circuit redistribution structure according to one embodiment of this disclosure.
Figure 1B:
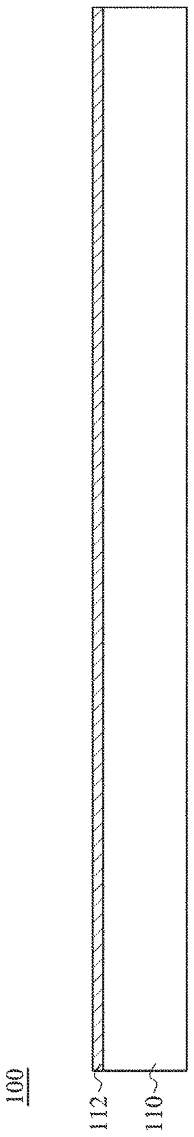
Figure 1C:
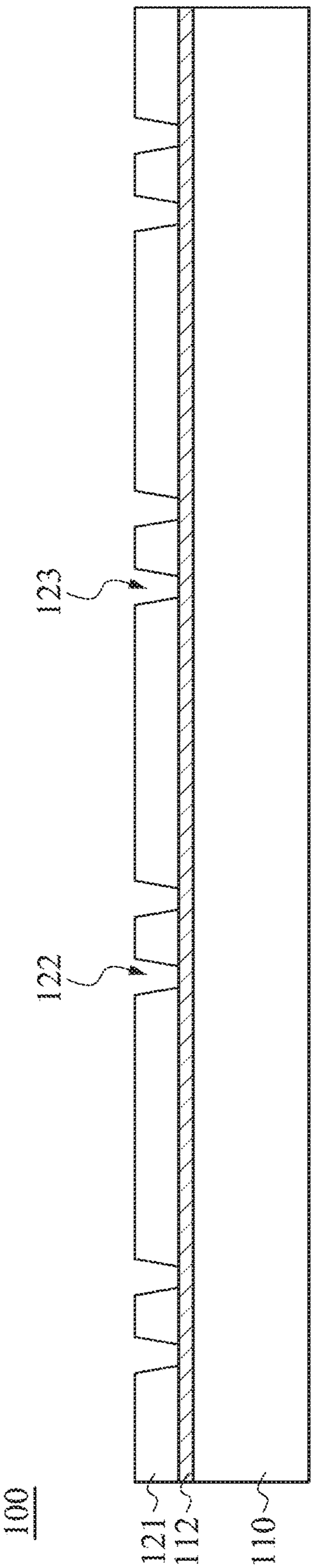
Figure 1D:
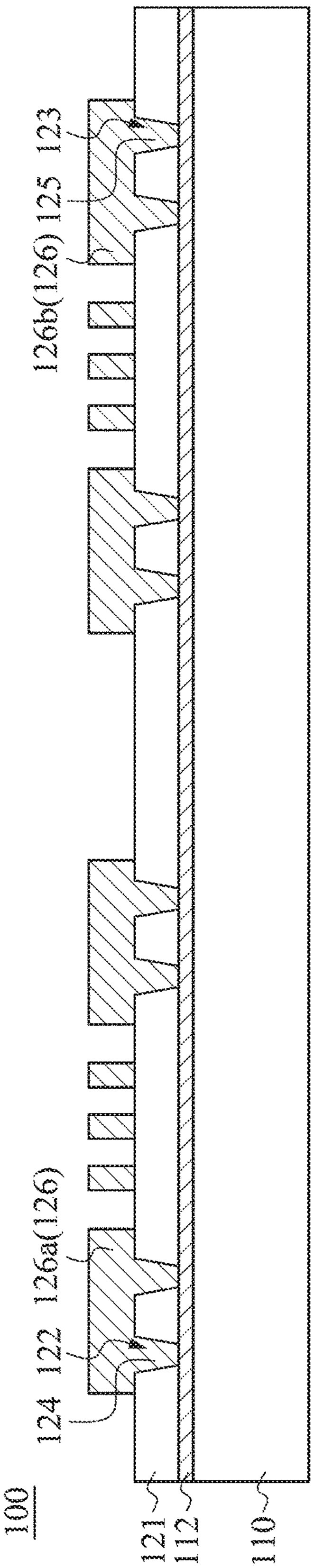
Figure 1E:
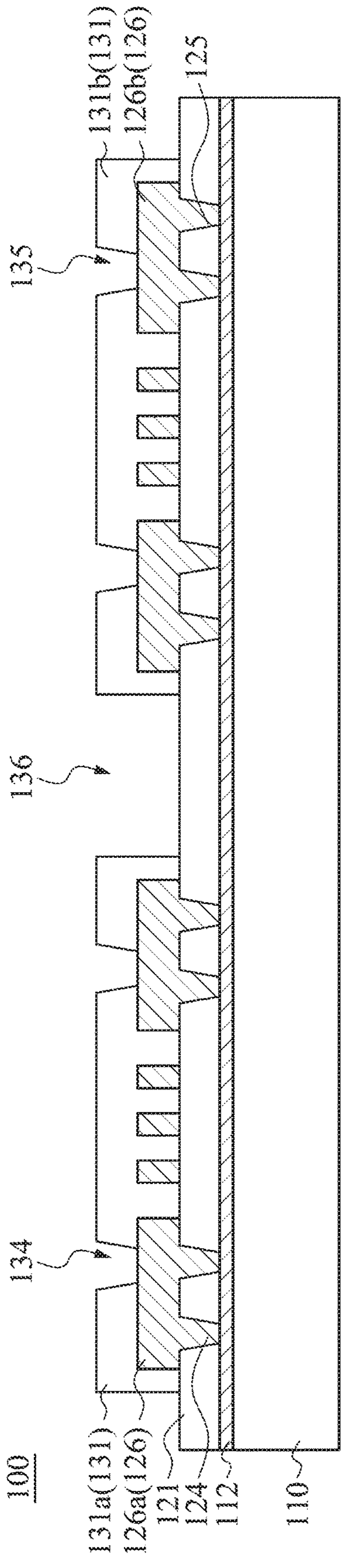
Figure 1F:
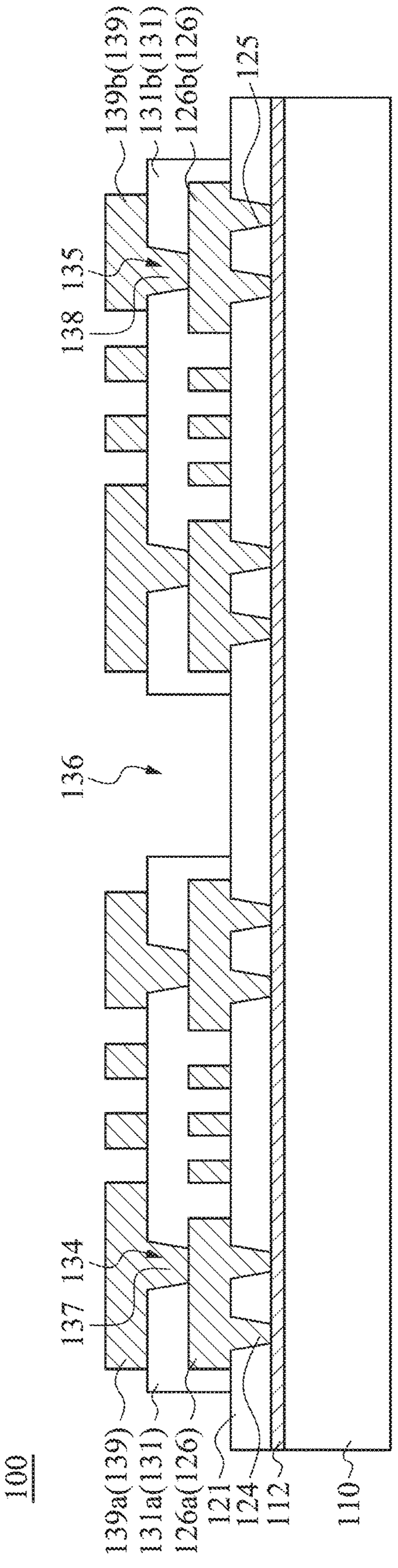
Figure 1G:
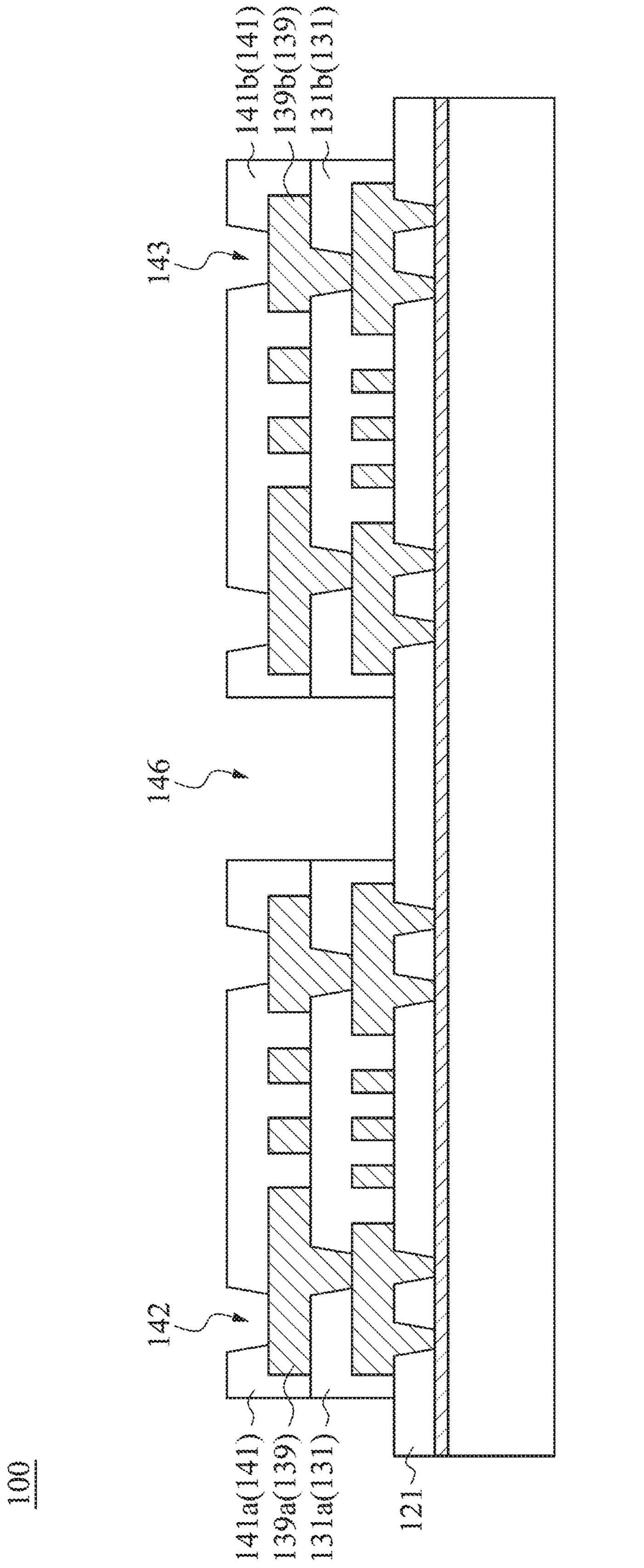
Figure 1H:
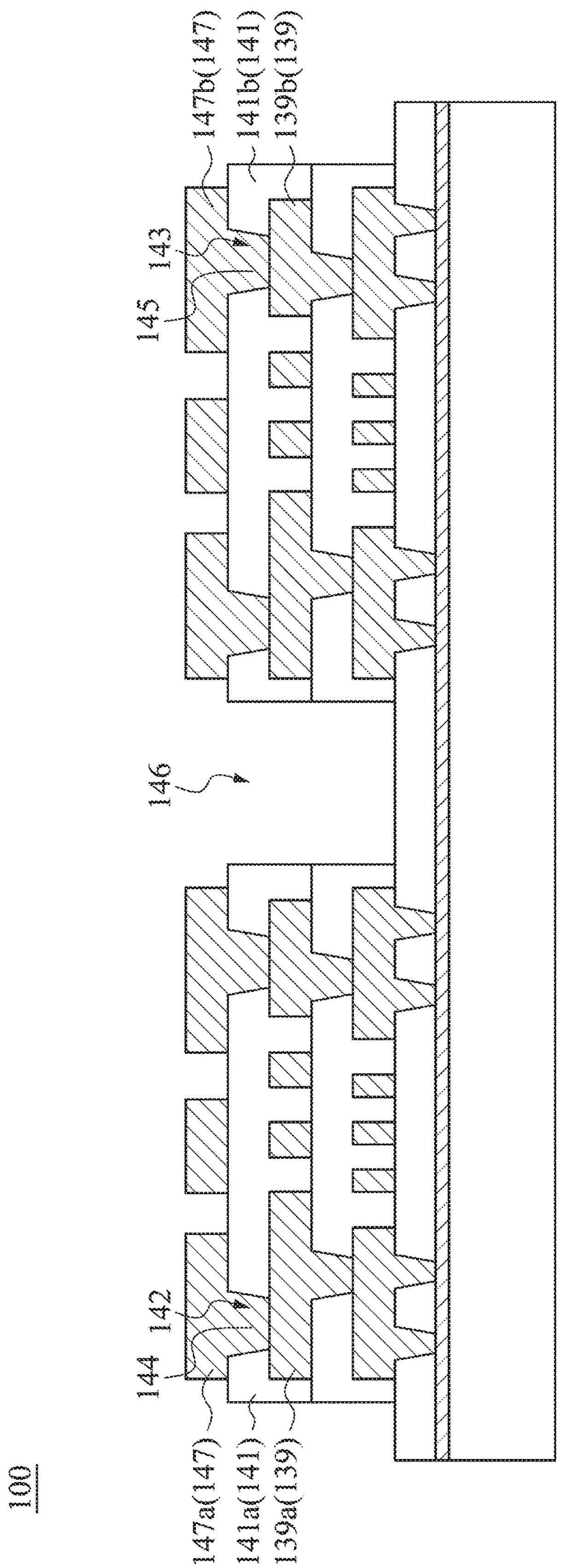
Figure 1I:
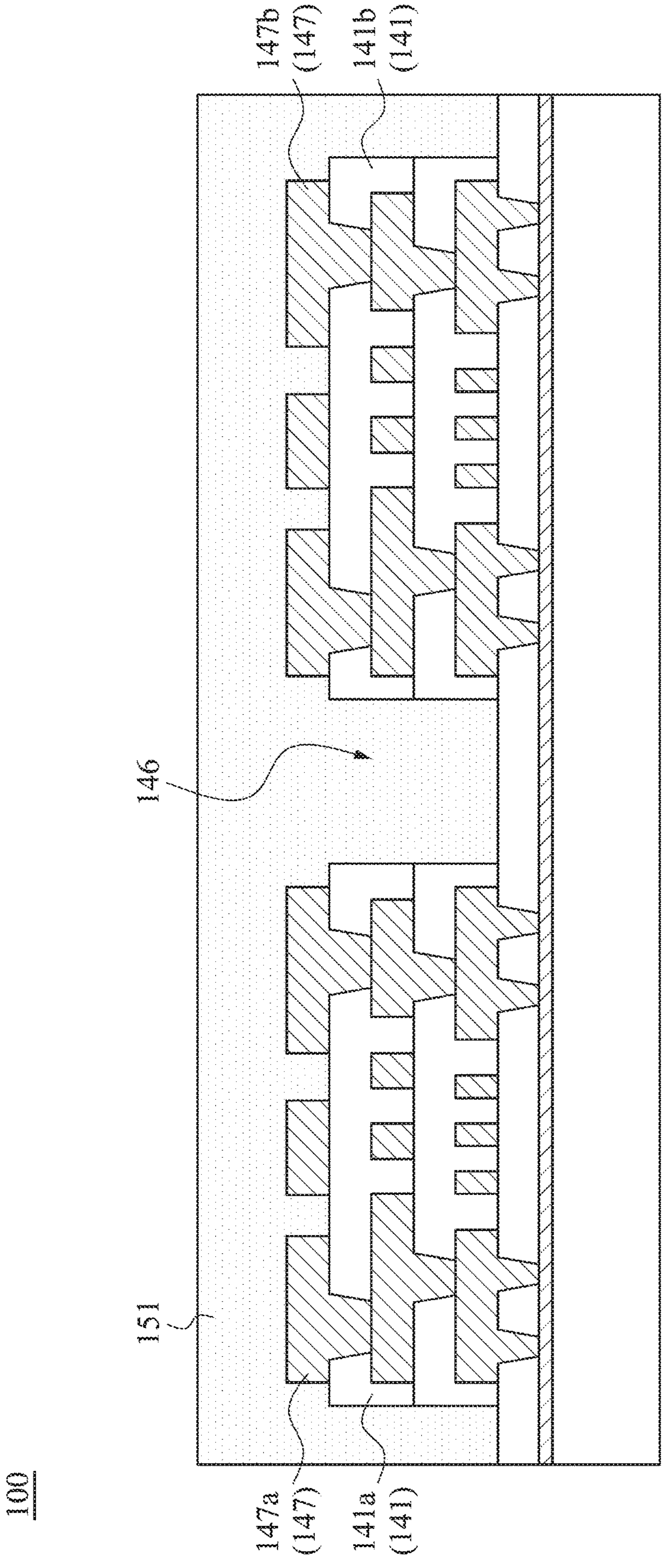
Figure 1J:
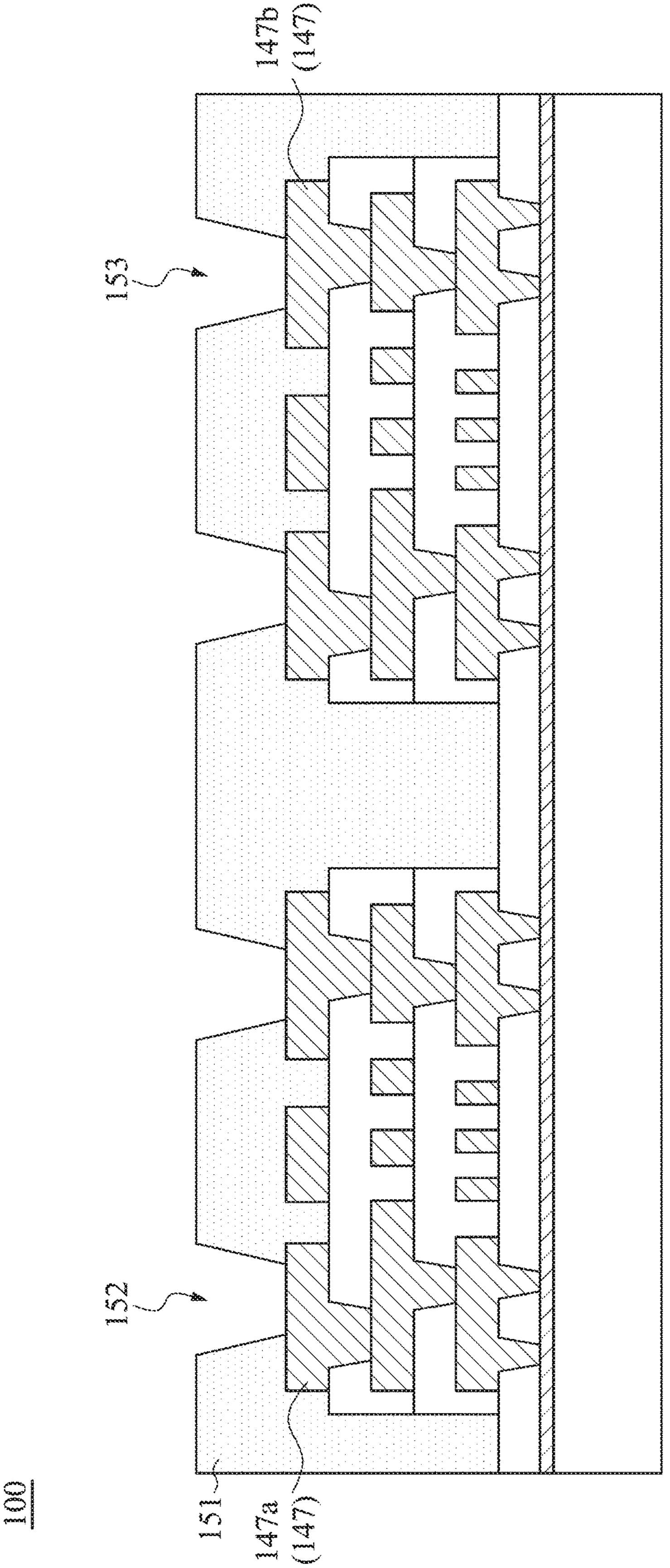
Figure 1K:
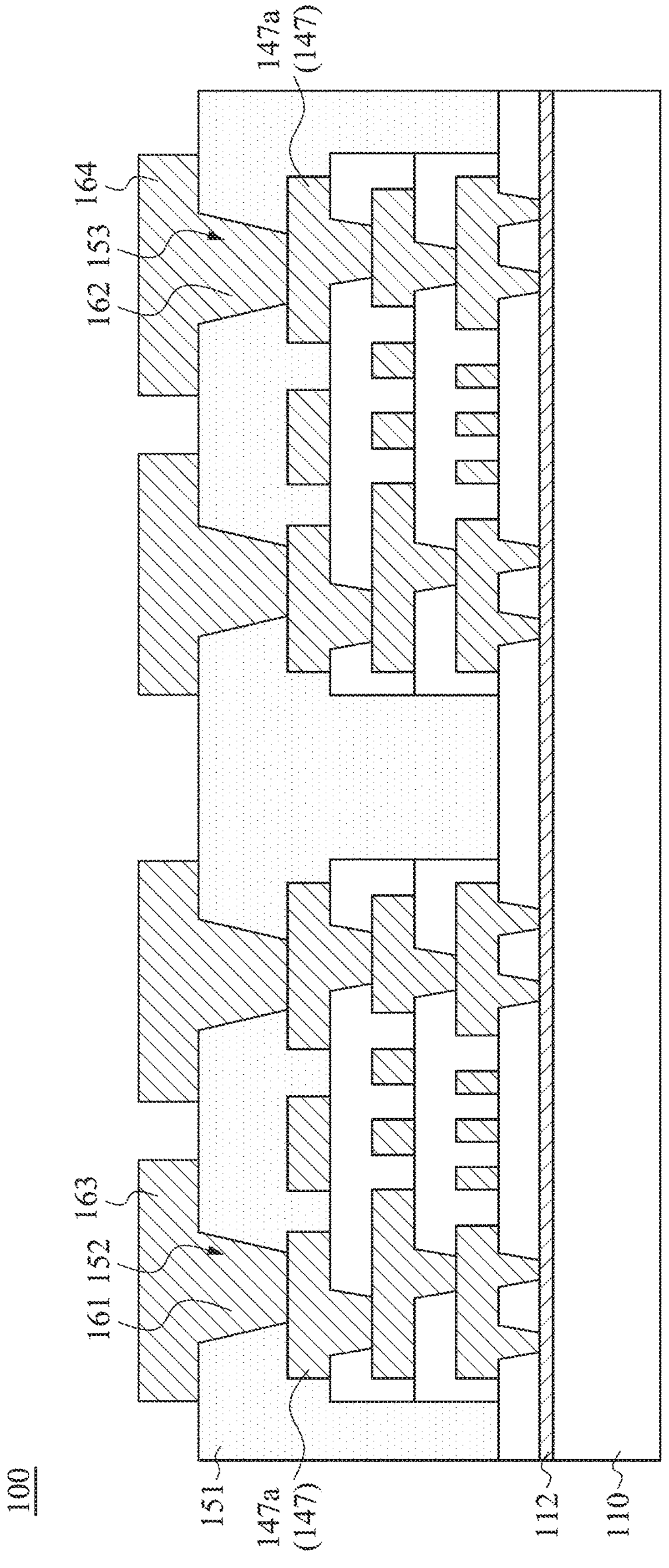
Figure 1L:
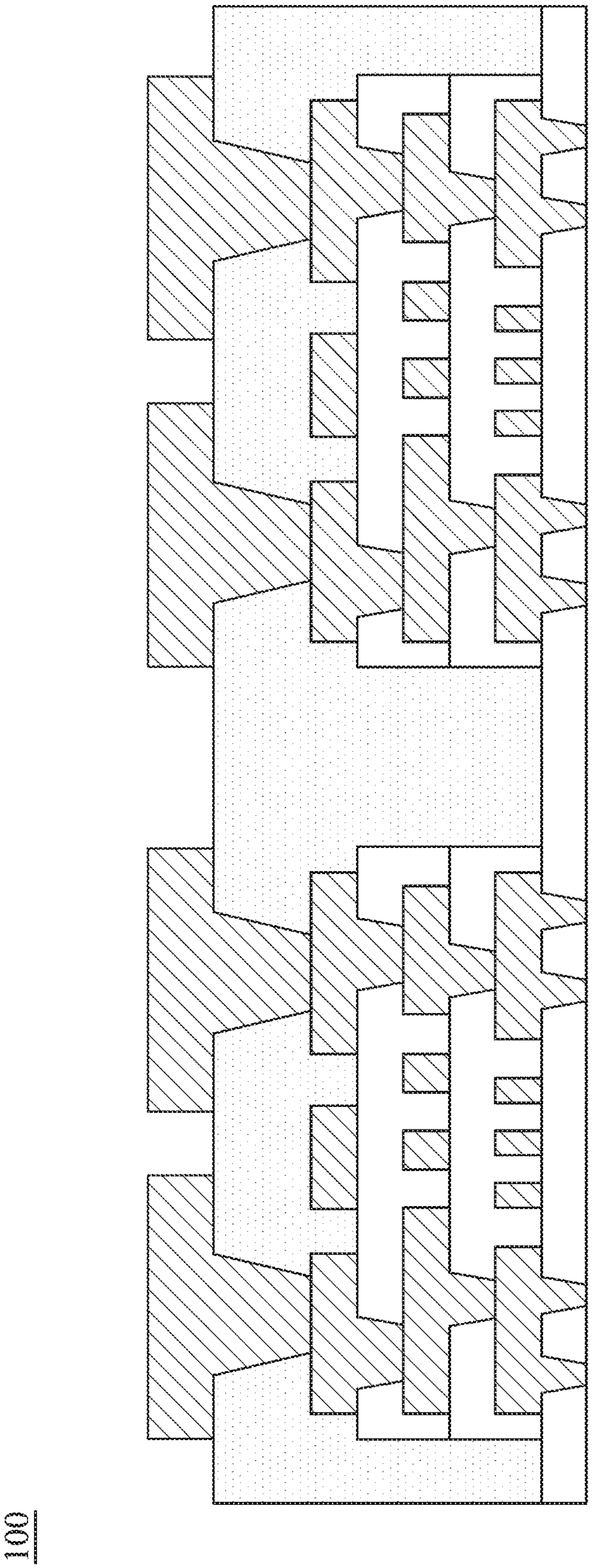
Figure 1M:
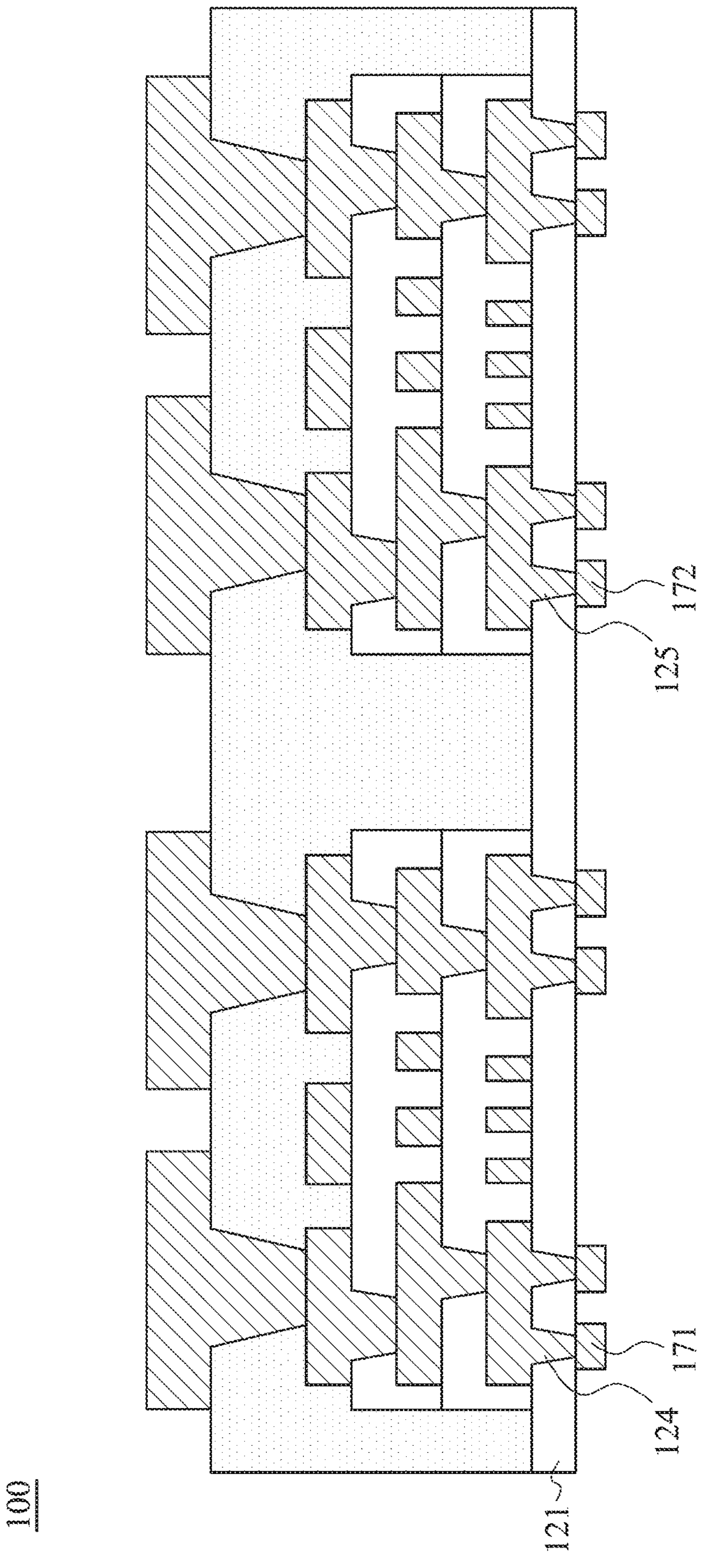
Figure 1N:
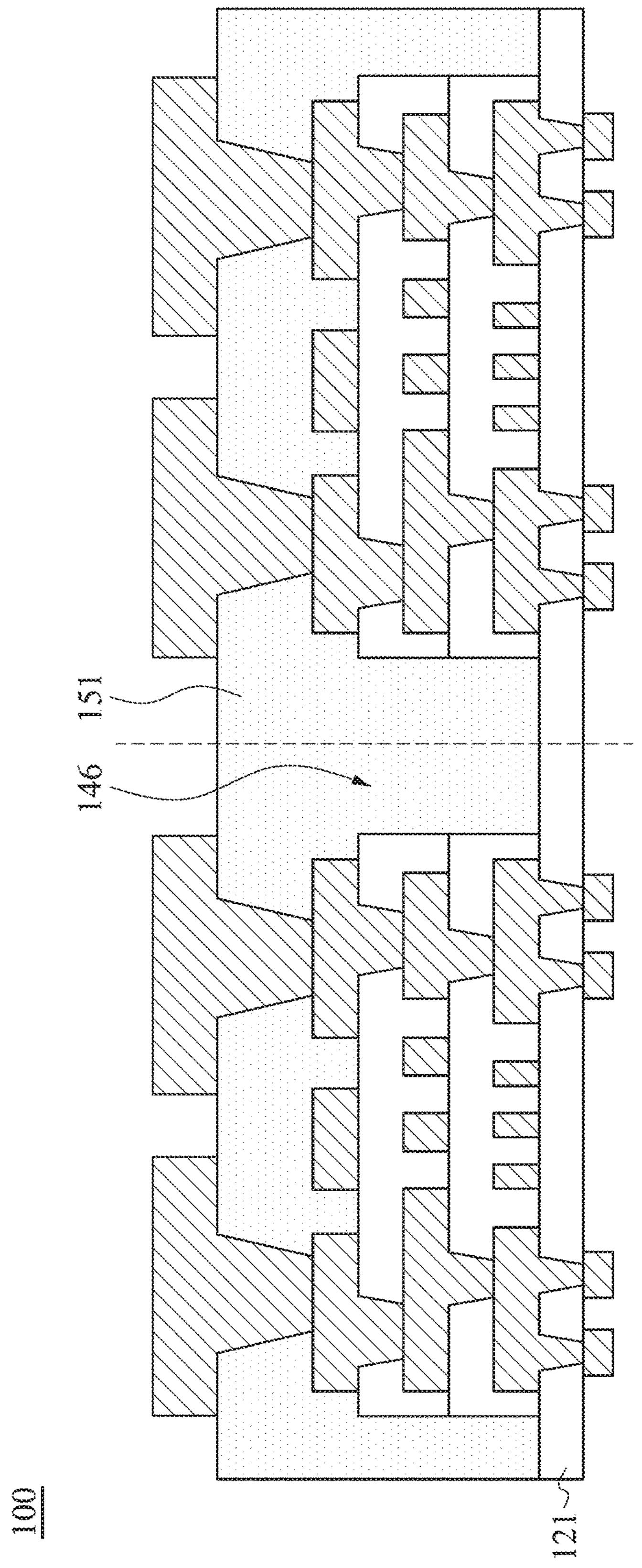
Figure 1O:
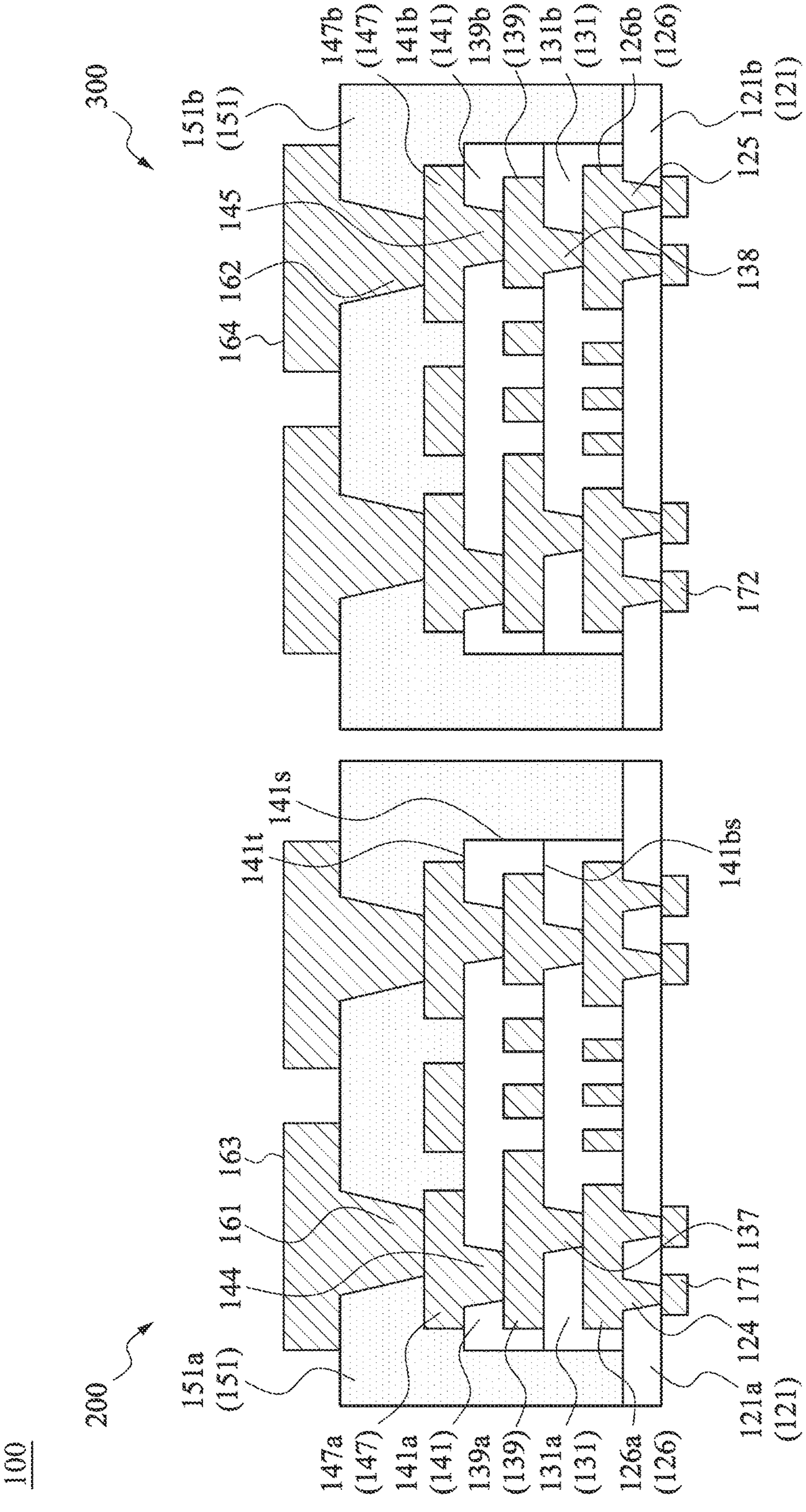

FIG. 1A to FIG. 1O are schematic cross-sectional views of intermediate steps in a method for manufacturing a circuit redistribution structure 100 according to one embodiment of this disclosure. As shown in FIG. 1A, a carrier 110 is provided.

The carrier 110 may be made of glass. Embodiments of this disclosure are not limited thereto. The person having ordinary skill in the art can make proper modifications to the carrier 110 depending on actual applications.

As shown in FIG. 1B, a release film 112 is formed on the carrier 110.

The release film 112 may be made of polyethylene terephthalate (PET). Embodiments of this disclosure are not limited thereto. The person having ordinary skill in the art can make proper modifications to the release film 112 depending on actual applications.

As shown in FIG. 1C, a dielectric layer 121 is formed on the release film 112. Then, a plurality of holes 122 and a plurality of holes 123 are formed in the first dielectric layer 121.

As shown in FIG. 1D, a plurality of conductive vias 124 and a plurality of conductive vias 125 are respectively formed in the holes 122 and the holes 123, and a circuit redistribution layer 126 is formed on the dielectric layer 121. A first portion 126*a* of the circuit redistribution layer 126 is electrically connected to the conductive vias 124, and a second portion 126*b* of the circuit redistribution layer 126 is electrically connected to the second conductive vias 125.

As shown in FIG. 1E, a dielectric layer 131 is formed on the dielectric layer 121 and the circuit redistribution layer 126. Then, a plurality of holes 134 and a plurality of holes 135 are formed in the dielectric layer 131 to respectively expose the first portion 126*a* and the second portion 126*b* of the circuit redistribution layer 126, and a trench 136 is formed in the dielectric layer 131 to expose the dielectric layer 121 and divide the dielectric layer 131 into a first portion 131*a* and a second portion 131*b*. The first portion 126*a* of the circuit redistribution layer 126 and the holes 134 are disposed in the first portion 131*a* of the dielectric layer 131, and the second portion 126*b* of the circuit redistribution layer 126 and the holes 135 are disposed in the second portion 131*b* of the dielectric layer 131.

As shown in FIG. 1F, a plurality of conductive vias 137 and a plurality of conductive vias 138 are respectively formed in the holes 134 and holes 135, and a first portion 139*a* of a circuit redistribution layer 139 is formed on the first portion 131*a* of the dielectric layer 131 and a second portion 139*b* of the circuit redistribution layer 139 is formed on the second portion 131*b* of the dielectric layer 131. The first portion 139*a* of the circuit redistribution layer 139 is electrically connected to the conductive vias 137, and the second portion 139*b* of the circuit redistribution layer 139 is electrically connected to the conductive vias 138.

As shown in FIG. 1G, a dielectric layer 141 is formed on the dielectric layer 131 and the circuit redistribution layer 139. Then, a plurality of holes 142 and a plurality of holes 143 are formed in the dielectric layer 141 to respectively expose the first portion 139*a* and the second portion 139*b* of the circuit redistribution layer 139, and a trench 146 is formed in the dielectric layer 141 to expose the dielectric layer 121 and divide the dielectric layer 141 into a first portion 141*a* and a second portion 141*b*. The first portion 139*a* of the circuit redistribution layer 139 and the holes 142 are disposed in the first portion 141*a* of the dielectric layer 141, and the second portion 139*b* of the circuit redistribution layer 139 and the holes 143 are disposed in the second portion 141*b* of the dielectric layer 141.

As shown in FIG. 1H, a plurality of conductive vias 144 and a plurality of conductive vias 145 are respectively formed in the holes 142 and holes 143, and a first portion 147*a* of a circuit redistribution layer 147 is formed on the first portion 141*a* of the dielectric layer 141 and a second portion 147*b* of the circuit redistribution layer 147 is formed on the second portion 141*b* of the dielectric layer 141. The first portion 147*a* of the circuit redistribution layer 147 is electrically connected to the conductive vias 144, and the second portion 147*b* of the circuit redistribution layer 147 is electrically connected to the conductive vias 145.

As shown in FIG. 1I, an encapsulation layer 151 is formed on the dielectric layer 141 and the circuit redistribution layer 147 and in the trench 146.

As shown in FIG. 1J, a plurality of holes 152 and a plurality of holes 153 are formed in the encapsulation layer 151 to respectively expose the first portion 147*a* and the second portion 147*b* of the circuit redistribution layer 147.

As shown in FIG. 1K, a plurality of conductive vias 161 and a plurality of conductive vias 162 are respectively formed in the holes 152 and holes 153, and a plurality of conductive bumps 163 and a plurality of conductive bumps 164 are formed on the encapsulation layer 151. The conductive bumps 163 are electrically connected to the conductive vias 161, and the conductive bumps 164 are electrically connected to the conductive vias 162.

As shown in FIG. 1K and FIG. 1L, the release film 112 and the carrier 110 are removed.

As shown in FIG. 1M, a plurality of micro bumps 171 and a plurality of micro bumps 172 are respectively formed on the conductive vias 124 and conductive vias 125 exposed by the dielectric layer 121.

As shown in FIG. 1N and FIG. 1O, the dielectric layer 121 and the encapsulation layer 151 in the trench 146 are cut to form a circuit redistribution structure unit 200 and a circuit redistribution structure unit 300. The circuit redistribution structure unit 200 includes the first portion 121*a* of the dielectric layer 121, the conductive vias 124, the first portion 126*a* of the circuit redistribution layer 126, the first portion 131*a* of the dielectric layer 131, the conductive vias 137, the first portion 139*a* of the circuit redistribution layer 139, the first portion 141*a* of the dielectric layer 141, the conductive vias 144, the first portion 147*a* of the circuit redistribution layer 147, the conductive vias 161, the conductive bumps 163, the micro bumps 171, and a first portion 151*a* of the encapsulation layer 151. The circuit redistribution structure unit 300 includes the second portion 121*b* of the dielectric layer 121, the conductive vias 125, the second portion 126*b* of the circuit redistribution layer 126, the second portion 131*b* of the dielectric layer 131, the conductive vias 138, the second portion 139*b* of the circuit redistribution layer 139, the second portion 141*b* of the dielectric layer 141, the conductive vias 145, the second portion 147*b* of the circuit redistribution layer 147, the conductive vias 162, the conductive bumps 164, the micro bumps 172, and a second portion 151*b* of the encapsulation layer 151.

In the aforementioned processes for manufacturing the circuit redistribution structure units 200 and 300, because the trench 136 is formed after the dielectric layer 131 is formed to divide the dielectric layer 131 into the first portion 131*a* and the second portion 131*b*, and the trench 146 is formed after the dielectric layer 141 is formed to divide the dielectric layer 141 into the first portion 141*a* and the second portion 141*b*, the internal stress of the dielectric layers 131 and 141 will be relieved, such that the warpage of the overall structure will not happen. Therefore, the structure stability is enhanced.

At the same time, because the warpage of the overall structure will not happen, the line widths and pitches of the circuit redistribution layers 126, 139, and 147 can become smaller without affecting the circuit stability of the circuit redistribution structure units 200 and 300, such that the performance of the circuit redistribution structure units 200 and 300 is enhanced.

In addition, because the internal stresses of the dielectric layers 131 and 141 are relieved, the warpage of the overall structure will not happen even when the circuit redistribution structure units 200 and 300 do not include interposer structures. Therefore, because the circuit redistribution structure units 200 and 300 do not include the interposer structures, the thickness and the material costs of the circuit redistribution structure units 200 and 300 are significantly reduced. At the same time, because the assembling processes related to the interposer structures are not needed, the manufacturing cost can be further reduced.

The dielectric layers 121, 131, and 141 may be made of photosensitive dielectric material, such as DIF03 manufactured by Hitachi. Embodiments of this disclosure are not limited thereto. The person having ordinary skill in the art can make proper modifications to the material of the dielectric layers 121, 131, and 141 depending on actual applications.

The circuit redistribution layers 126, 139, and 147, the conductive vias 124, 125, 137, 138, 144, 145, 161, and 162, and the conductive bumps 163 and the conductive bumps 164 may be made of copper, tungsten, aluminum, or an alloy of at least two of the aforementioned metals.

The encapsulation layer 151 may be made of epoxy. Embodiments of this disclosure are not limited thereto. The person having ordinary skill in the art can make proper modifications to the material of the encapsulation layer 151 depending on actual applications.

The micro bumps 171 and the micro bumps 172 may be made of copper, tungsten, aluminum, or an alloy of at least two of the aforementioned metals. Alternatively, the micro bumps 171 and the micro bumps 172 may be made of electroless nickel/electroless gold, electroless nickel immersion gold, electroless nickel palladium immersion gold, electroless tin, or a combination thereof.

The holes 122, the holes 123, the holes 134, the holes 135, the holes 142, and the holes 143 and the trenches 136 and 144 may be formed by exposure and development. Embodiments of this disclosure are not limited thereto. The person having ordinary skill in the art can make proper modifications to the forming method of the holes 122, 123, 134, 135, 142, and 143 and the trenches 136 and 144 depending on actual applications.

The forming method of the conductive vias 124, the conductive vias 125, the conductive vias 137, the conductive vias 138, the conductive vias 144, and the conductive vias 145, the circuit redistribution layers 126, 139, and 147, and the conductive bumps 163 and the conductive bumps 164 may include the following operations. First, a photoresist layer (not shown in Figs.), such as a dry film, is formed on the dielectric layer 121, 131, and/or 141 and/or the encapsulation layer 151. Then, the photoresist layer is patterned by lithography to partially expose the dielectric layer 121, the dielectric layer 131, and/or the dielectric layer 141 and/or the encapsulation layer 151. Then, an electroplating process is performed. Then, the photoresist layer is removed to formed the conductive vias 124, the conductive vias 125, the conductive vias 137, the conductive vias 138, the conductive vias 144, and the conductive vias 145, the circuit redistribution layer 126, 139, and 147, and the conductive bumps 163 and the conductive bumps 164.

The encapsulation layer 151 may be formed by lamination. Embodiments of this disclosure are not limited thereto. The person having ordinary skill in the art can make proper modifications to the forming method of the encapsulation layer 151 depending on actual applications.

The holes 152 and the holes 153 may be formed by laser-ablating the encapsulation layer 151. Embodiments of this disclosure are not limited thereto. The person having ordinary skill in the art can make proper modifications to the forming method of the holes 152 and 153 depending on actual applications.

The dielectric layer 121 and the encapsulation layer 151 may be cut by a cutter. Embodiments of this disclosure are not limited thereto. The person having ordinary skill in the art can make proper modifications to the cutting method of the dielectric layer 121 and the encapsulation layer 151 depending on actual applications.

The micro bumps 171 and the micro bumps 172 may be formed by electroplating or electroless plating. Embodiments of this disclosure are not limited thereto. The person having ordinary skill in the art can make proper modifications to the forming method of the micro bumps 171 and 172 depending on actual applications.

In this embodiment, the thickness of the circuit redistribution structure units 200 and 300 and may be in a range from about 40 μm to about 50 μm. The line widths and pitches of the circuit redistribution structure units 200 and 300 may be in a range from about 10 μm to about 50 μm.

In this embodiment, the thickness of the dielectric layers 121, 131, and 141 may be in a range from about 10 μm to about 30 μm. Embodiments of this disclosure are not limited thereto. The person having ordinary skill in the art can make proper modifications to the thickness of the dielectric layers 121, 131, and 141 depending on actual applications.

In this embodiment, each of the circuit redistribution structure units 200 and 300 includes three circuit redistribution layers and corresponding dielectric layers and conductive vias. Embodiments of this disclosure are not limited thereto. In other embodiments, each of the circuit redistribution structure units 200 and 300 may include two, four, or more circuit redistribution layers and corresponding dielectric layers and conductive vias.

In addition, in this embodiment, the circuit redistribution structure 100 is divided into two circuit redistribution structure units. Embodiments of this disclosure are not limited thereto. In other embodiments, the circuit redistribution structure 100 may be divided into three or more circuit redistribution structure units.

As shown in FIG. 1O, a circuit redistribution structure unit 200 may be manufactured by the processes shown in FIG. 1A to FIG. 1O. The circuit redistribution structure 200 includes dielectric layers 121, 131, and 141, a plurality of conductive vias 124, a plurality of conductive vias 137, a plurality of conductive vias 144, a plurality of conductive vias 161, circuit redistribution layers 126, 139, and 147, an encapsulation layer 151, a plurality of conductive bumps 163, and a plurality of micro bumps 171. The conductive vias 124 are disposed in the dielectric layer 121. The circuit redistribution layer 126 are disposed on the dielectric layer 121 and electrically connected to the conductive vias 124. The dielectric layer 131 is disposed on the dielectric layer 121 and the circuit redistribution layer 126. The conductive vias 137 are disposed in the dielectric layer 131 and electrically connected to the circuit redistribution layer 126. The circuit redistribution layer 139 is disposed on the dielectric layer 131 and electrically connected to the conductive vias 137. The dielectric layer 141 is disposed on the dielectric layer 131 and the circuit redistribution layer 139. The conductive vias 144 are disposed in the dielectric layer 141 and electrically connected to the circuit redistribution layer 139. The circuit redistribution layer 147 is disposed on the dielectric layer 141 and electrically connected to the conductive vias 144. The encapsulation layer 151 is disposed on the dielectric layer 141 and the circuit distribution layer 147. The dielectric layer 141 has a first surface 141*t*, a second surface 141*bs* opposite to the first surface 141*t*, and a side surface 141*s* connected to the first surface 141*t* and the second surface 141*bs*. The circuit redistribution layer 147 is disposed on the first surface 141*t*, and the encapsulation layer 151 covers the first surface 141*t* and the side surface 141*s*. The conductive vias 161 are disposed in the encapsulation layer 151 and electrically connected to the circuit redistribution layer 147. The conductive bumps 163 are disposed on the encapsulation layer 151 and electrically connected to the conductive vias 161. The micro bumps 171 are disposed on one side of the dielectric layer 121 opposite to the dielectric layer 131 and respectively electrically connected to the conductive vias 124.

The encapsulation layer 151 is further disposed on the dielectric layer 121 exposed by the dielectric layers 131 and 141, and the thickness of the encapsulation layer 151 disposed on the dielectric layer 121 is greater than the thickness of the encapsulation layer 151 disposed on the dielectric layer 141.

Figure 2A:
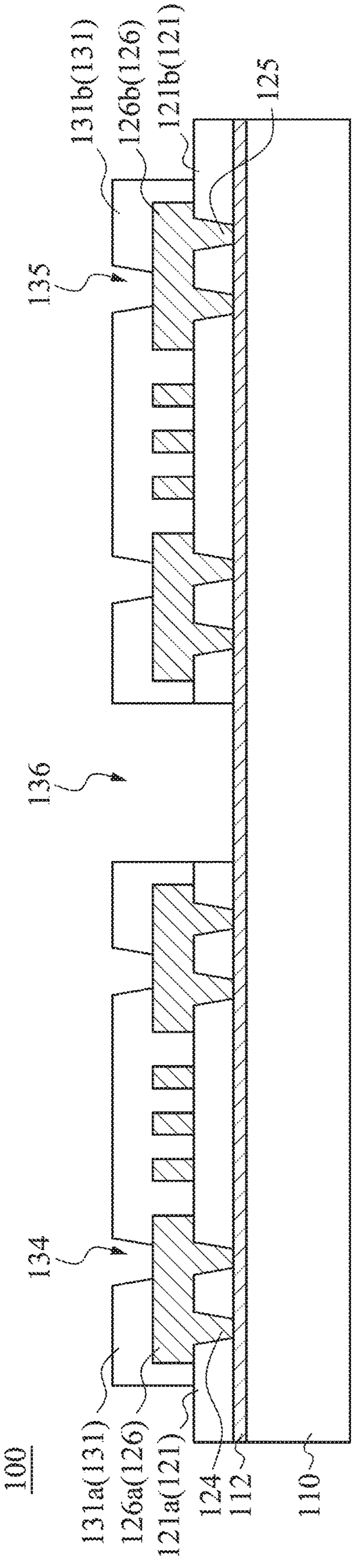
FIG. 2A, FIG. 2B, and FIG. 2C are schematic cross-sectional views of intermediate steps in the method for manufacturing the circuit redistribution structure according to another embodiment of this disclosure.
Figure 2B:
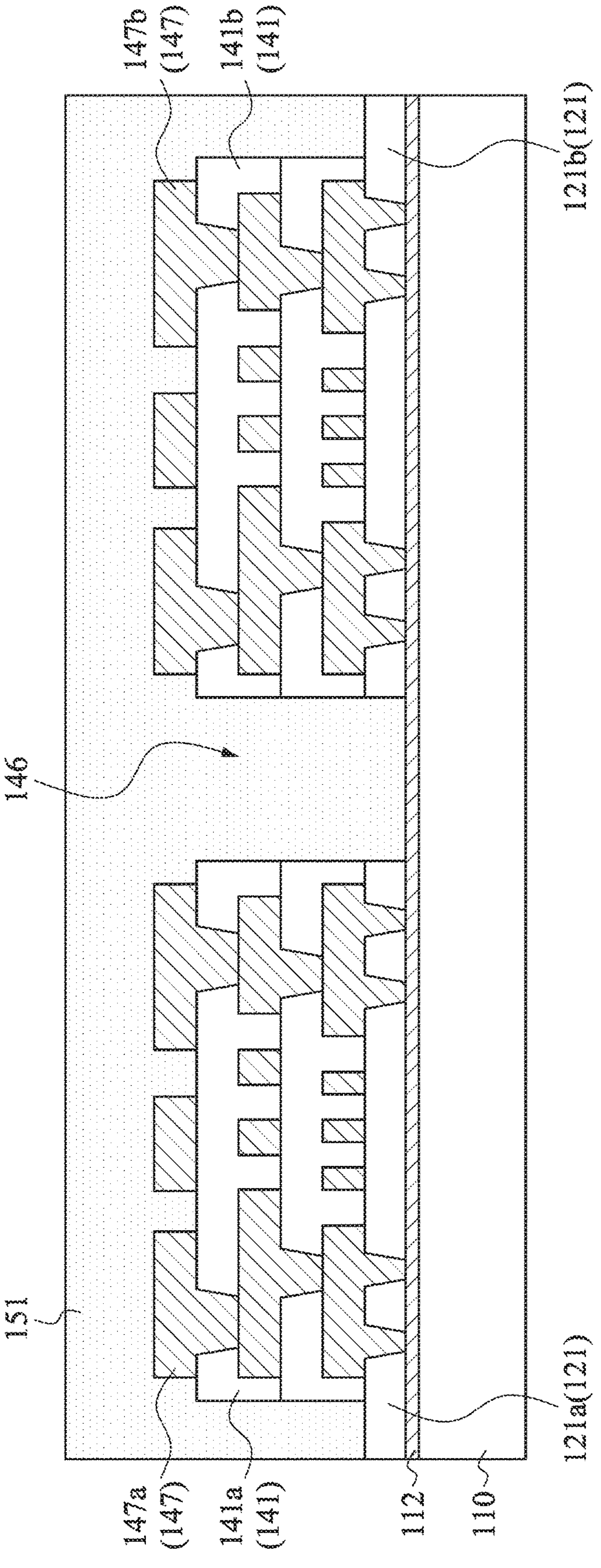
Figure 2C:
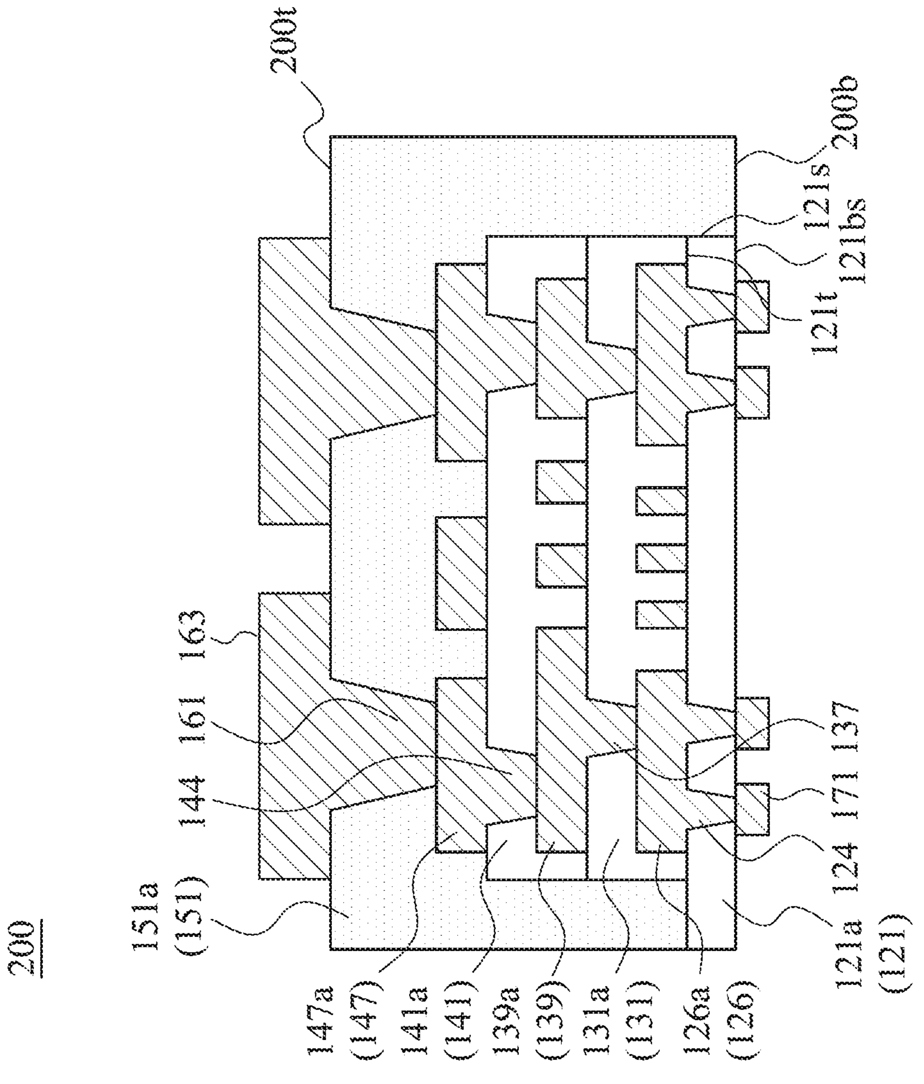

FIG. 2A, FIG. 2B, and FIG. 2C are schematic cross-sectional views of intermediate steps in the method for manufacturing the circuit redistribution structure 100 according to another embodiment of this disclosure. As shown in FIG. 2A, when the trench 136 is formed, the trench 136 is further formed in the dielectric layer 121 to expose the release film 112 (or the carrier 110), and the trench 136 divides the dielectric layer 121 to the first portion 121*a* and the second portion 121*b*. Similarly, as shown in FIG. 2B, when the trench 146 is formed, the trench 146 further exposes the release film 112 (or the carrier 110), and the trench 146 divides the dielectric layer 121 to the first portion 121*a* and the second portion 121*b*. Therefore, as shown in FIG. 2C, when the circuit redistribution structure unit 200 is formed, the encapsulation layer 151 forms a portion of a first surface 200*t* and a portion of a second surface 200*b* of the circuit redistribution structure unit 200, in which the second surface 200*b* is opposite to the first surface 200*t*. In addition, the encapsulation layer 151 covers a portion of a side surface 121*s* of the dielectric layer 121 (the side surface 121*s* is connected to a first surface 121*t* and a second surface 121*bs* of the dielectric layer 121, in which the second surface 121*bs* is opposite to the first surface 121*t*, and the circuit redistribution layer 126 is disposed on the first surface 121*t*).

Figure 3:
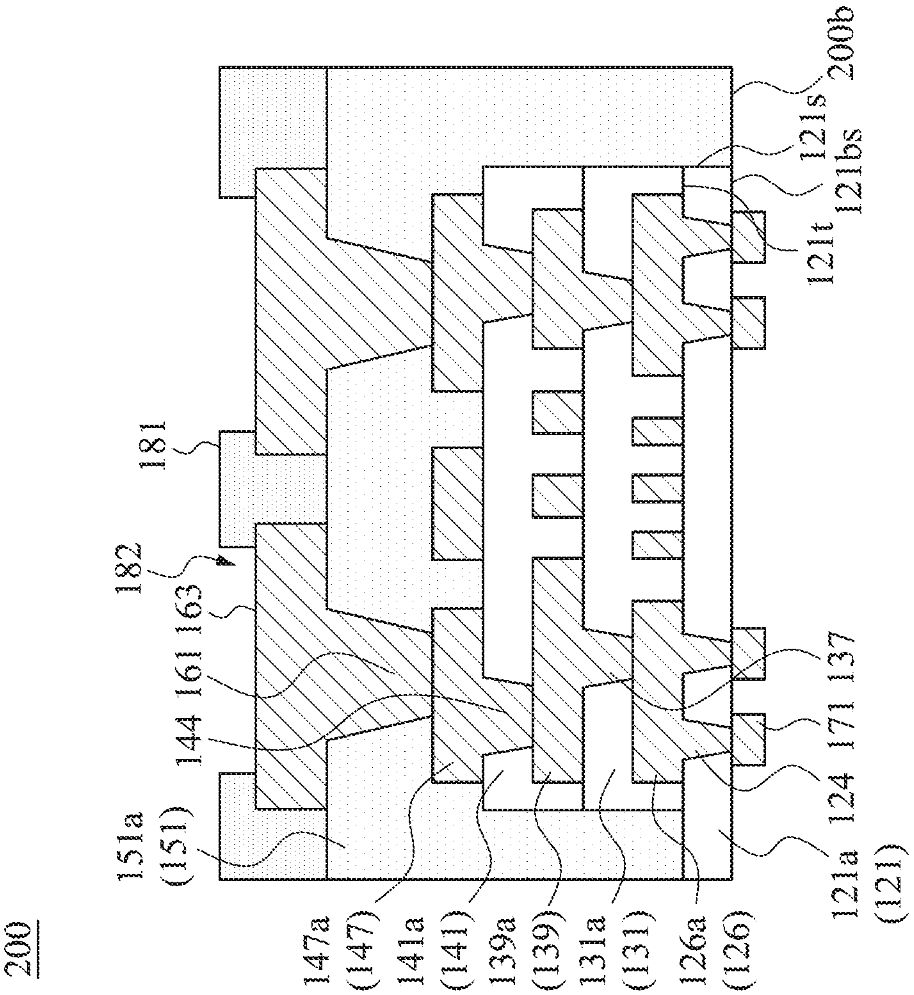
FIG. 3 is a schematic cross-sectional view of the circuit redistribution structure unit according to another embodiment of this disclosure.

FIG. 3 is a schematic cross-sectional view of the circuit redistribution structure unit 200 according to another embodiment of this disclosure. In this embodiment, after the conductive bumps 163 are formed, a solder resist layer 181 is formed on the encapsulation layer 151 and the conductive bumps 163. Therefore, as shown in FIG. 3, the conductive bumps 163 are disposed in openings of the solder resist layer 181.

The solder resist layer 181 may be made of resin, such as epoxy. Embodiments of this disclosure are not limited thereto. The person having ordinary skill in the art can make proper modifications to the material of the solder resist layer 181 depending on actual applications.

Figure 4:
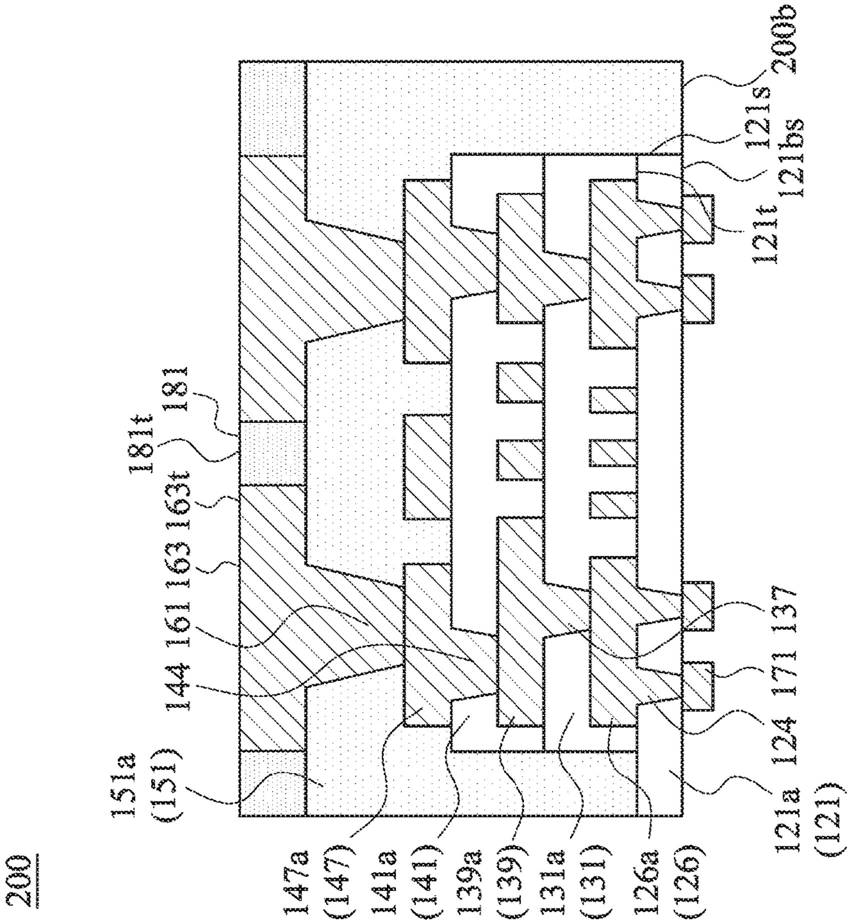
FIG. 4 is a schematic cross-sectional view of the circuit redistribution structure unit according to another embodiment of this disclosure.

FIG. 4 is a schematic cross-sectional view of the circuit redistribution structure unit 200 according to another embodiment of this disclosure. As shown in FIG. 4, the circuit redistribution structure unit 200 of this embodiment is similar to the circuit redistribution structure unit 200 of FIG. 3, and the main difference is that, in this embodiment, a main surface 163*t* of the conductive bumps 163 and a main surface 181*t* of the solder resist layer 181 substantially form a surface. The main surface 163*t* and the main surface 181*t* face one side of the circuit redistribution structure unit 200.

Because the trenches 136 and 144 are formed to divide the dielectric layers 131 and 141 into two portions, the internal stress of the dielectric layers 131 and 141 will be relieved, such that the warpage of the overall structure will not happen. Therefore, the structure stability is enhanced. At the same time, because the warpage of the overall structure will not happen, the line widths and pitches of the circuit redistribution layers 126, 139, and 147 can become smaller without affecting the circuit stability of the circuit redistribution structure units 200 and 300, such that the performance of the circuit redistribution structure units 200 and 300 are enhanced. Because the internal stresses of the dielectric layers 131 and 141 are relieved, the warpage of the overall structure will not happen even when the circuit redistribution structure units 200 and 300 do not include interposer structures. Therefore, because the circuit redistribution structure units 200 and 300 do not include the interposer structures, the thickness and the material costs of the circuit redistribution structure units 200 and 300 are significantly reduced. At the same time, because the assembling processes related to the interposer structures are not needed, the manufacturing cost can be further reduced.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A circuit redistribution structure unit, comprising:

a first dielectric layer;

a plurality of first conductive vias disposed in the first dielectric layer;

a first circuit redistribution layer disposed on the first dielectric layer and electrically connected to the first conductive vias;

a second dielectric layer disposed on the first dielectric layer and the first circuit redistribution layer;

a plurality of second conductive vias disposed in the second dielectric layer and electrically connected to the first circuit redistribution layer;

a second circuit redistribution layer disposed on the second dielectric layer and electrically connected to the second conductive vias;

an encapsulation layer disposed on the second dielectric layer and the second circuit distribution layer, wherein the second dielectric layer has a first surface, a second surface opposite to the first surface, and a side surface connecting the first surface and the second surface, the second circuit redistribution layer is disposed on the first surface, and the encapsulation layer covers the first surface and the side surface;

a plurality of third conductive vias disposed in the encapsulation layer and electrically connected to the second circuit redistribution layer;

a plurality of conductive bumps disposed on the encapsulation layer and electrically connected to the third conductive vias; and a plurality of micro bumps disposed on one side of the first dielectric layer opposite to the second dielectric layer and respectively electrically connected to the first conductive vias.

2. The circuit redistribution structure unit of claim 1, wherein the encapsulation layer is further disposed on the first dielectric layer exposed by the second dielectric layer, and a thickness of the encapsulation layer disposed on the first dielectric layer is greater than a thickness of the encapsulation layer disposed on the second dielectric layer.

3. The circuit redistribution structure unit of claim 1, wherein the first dielectric layer and the second dielectric layer are made of photosensitive dielectric material.

* * * * *